United States Patent
Annequin

(10) Patent No.: US 6,354,855 B2
(45) Date of Patent: Mar. 12, 2002

(54) COAXIAL CONNECTOR

(75) Inventor: Sébastien Annequin, Fairfield, CT (US)

(73) Assignee: Radiall, Rosny-sous-Bois (FR)

( * ) Notice: Subject to any disclaimer, the term of this patent is extended or adjusted under 35 U.S.C. 154(b) by 0 days.

(21) Appl. No.: 09/828,465

(22) Filed: Apr. 6, 2001

(30) Foreign Application Priority Data

Apr. 7, 2000 (FR) .......................................... 00 04479

(51) Int. Cl.⁷ .............................................. H01R 13/64
(52) U.S. Cl. ...................................... 439/248; 439/939
(58) Field of Search ................................ 439/248, 247, 439/246, 939, 578, 92

(56) References Cited

U.S. PATENT DOCUMENTS

| | | | |
|---|---|---|---|
| 4,580,862 A | * 4/1986 | Johnson | 439/248 |
| 4,697,859 A | 10/1987 | Fisher, Jr. | 439/246 |
| 4,789,351 A | * 12/1988 | Fisher, Jr. et al. | 439/248 |
| 5,167,520 A | * 12/1992 | Henry et al. | 439/248 |
| 5,329,262 A | * 7/1994 | Fisher, Jr. | 439/248 |
| 5,516,303 A | 5/1996 | Yohn et al. | 439/248 |

FOREIGN PATENT DOCUMENTS

EP  0 159 116  10/1985

* cited by examiner

Primary Examiner—Brian Sircus
Assistant Examiner—Javaid Nasri
(74) Attorney, Agent, or Firm—Schweitzer Cornman Gross & Bondell LLP

(57) ABSTRACT

A coaxial connector is suitable for being received in an opening in a panel, in particular a wall of a metal box. The connector comprises a conductive tubular body, a conductive tubular grounding plate and at least one resilient member, said grounding plate being movable in translation coaxially relative to said body, said grounding plate having a continuous rigid bearing surface for pressing against said panel, and said at least one resilient member, in particular a spring, being arranged to urge the grounding plate into a given position relative to the tubular body and to press the grounding plate against said panel when the connector is assembled with a complementary connector element.

12 Claims, 3 Drawing Sheets

FIG_1

COAXIAL CONNECTOR

The present invention relates to a coaxial connector suitable for being received in an opening in a panel, in particular a wall of a metal box.

BACKGROUND OF THE INVENTION

It is known that the electromagnetic pollution generated by an electronic module can be limited and/or eliminated by covering the module with a metal box.

The metal box provides ground continuity around the module so as to constitute shielding between the module and the environment.

In such an implementation, an opening through the wall of the box for passing a connector cable constitutes a zone of electromagnetic leakage to the outside.

In order to preserve shielding of the electronic module, it is known to use shielded cables having shielding that is connected to the metal box.

That kind of connection is generally provided by means of a connector including a grounding plate which is electrically connected both to the body of the connector and to the metal box.

It is known that the grounding plate can be fixed to the metal box by means of a screw and nut type fastening or by means of a plurality of screws.

The connector can also be fixed to the metal box by means of an outside thread formed on the connector so that the connector can be screwed into tapping in the box.

Such fixing can also be obtained by forcing the connector into an opening in the wall of the box.

Those methods of fixing have the advantage of giving rise to shielding that is effective.

Nevertheless, they prevent the connector moving when fixed to the metal box and they give rise to complex operations for mounting the connector on the box and for dismounting it therefrom.

In order to simplify the operation of fixing the connector to the box, it is possible to fix a shielding bracelet so that it comes into contact both with the connector and with the box, thereby providing electrical continuity.

Nevertheless, such bracelets are expensive and provide little freedom of displacement for the connector relative to the box.

OBJECTS AND SUMMARY OF THE INVENTION

The present invention makes it possible simultaneously to obtain good shielding and fixing between the connector and the metal box that is relatively flexible.

This is achieved by the invention by means of a coaxial connector suitable for being received in an opening of a panel, in particular a wall of a metal box, the connector comprising a conductive tubular body, a conductive tubular grounding plate, and at least one resilient member, said grounding plate being movable in translation coaxially relative to said body, said grounding plate having a continuous rigid bearing surface for pressing against said panel, and said at least one resilient member, in particular a spring, being arranged to urge the grounding plate into a given position relative to the tubular body and to press the grounding plate against said panel when the connector is assembled with a complementary connector element.

This provides both mechanical support and electrical contact between the grounding plate and the panel without using additional support members.

The grounding plate can be mounted on the panel and it can be dismounted therefrom in particularly simple manner.

In a particular embodiment, the body and the grounding plate are circularly symmetrical.

Preferably, the body has an extension from its side wall constituting a housing in which said grounding plate can move axially.

In a particular embodiment, the extension has a second wall parallel and outside the wall of the body, said wall being interconnected by a radial wall defining the end wall of the housing.

Still in a particular embodiment, the grounding plate has a tubular portion that engages in the housing of the body, and that is extended at each end by a respective rigid radial collar, one of said collars being outwardly directed and forming the bearing surface for pressing against said panel, the other collar being inwardly directed and suitable for being brought to bear against the end wall of the housing of the body.

Advantageously, the tubular portion of the grounding plate co-operates with the wall of the body to form a second housing in which the resilient member is received, the inwardly-directed radial collar defining an end wall for said second housing and serving as a first bearing surface for the resilient member.

Preferably, the connector includes a fitting secured to the body and arranged to define a second bearing surface for the resilient member.

The fitting is advantageously substantially tubular in shape and is arranged in such a manner as to engage in part in the second housing of the grounding plate.

The connector may include snap-fastening means suitable for co-operating with corresponding means on a complementary connector element.

In a particular embodiment, the complementary connector element is a coaxial socket mounted on a printed circuit card placed in a metal box having an opening through which said connector is engaged.

Advantageously, the resilient member is a spring arranged in such a manner that its return force is smaller than the force required for disengaging the connector from the complementary connector element.

Preferably, the opening in the panel is made in such a manner that when the connector is received in said opening, the connector can move radially in said opening, while the grounding plate remains in contact with the panel.

This makes it possible to implement the opening with relatively large positioning tolerance.

It then suffices to adjust the position of the connector relative to a socket on which it is fixed, by displacing the connector radially in the housing.

BRIEF DESCRIPTION OF THE DRAWINGS

Other characteristics and advantages of the invention will appear on reading the following description of a non-limiting embodiment and on referring to the accompanying drawings, in which.

MORE DETAILED DESCRIPTION

Figure 1:
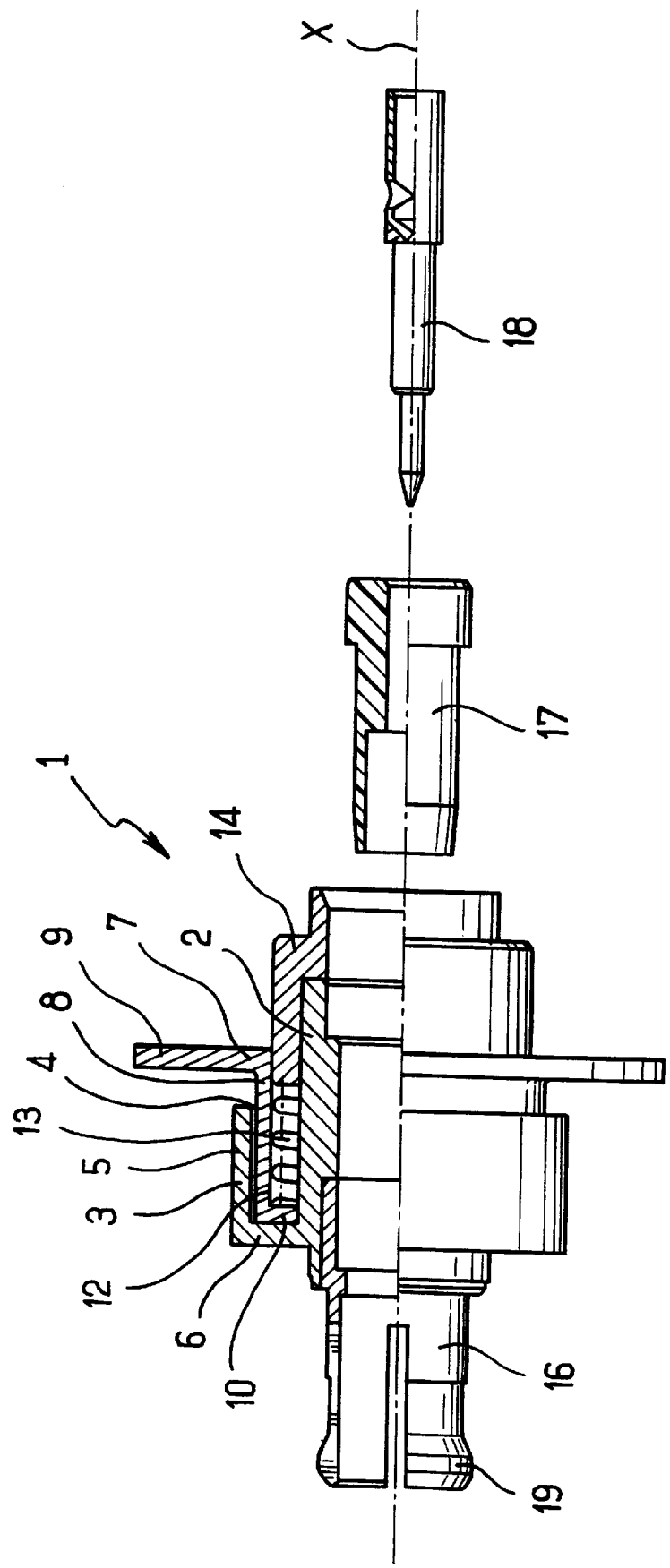
FIG. 1 is an exploded view of a coaxial connector of the invention, shown partially in section.

FIG. 1 shows a coaxial connector 1 comprising a body 2 that is circularly tubular about the axis X.

The body 2 has an extension 3 from its side wall that constitutes a housing 4.

The extension 3 has a tubular wall 5 that is circularly symmetrical about the axis X and parallel with the outside of the tubular wall of the body 2.

The wall 5 and the tubular wall of the body 2 are connected together by a radial wall 6 defining the end wall of the housing 4.

In the embodiment shown in FIG. 1, the axial length of the wall 5 is shorter than the axial length of the body 2.

The connector 1 also has a grounding plate 7 that is movable axially in the housing 4.

The body 2 and the grounding plate 7 are made of metal so as to co-operate with a metal box 20 to provide shielding for an electronic module on which the box is mounted.

The grounding plate 7 has a tubular portion 8 that is circularly symmetrical about the axis X and that is extended at each end by a rigid radial collar, one of the collars being outwardly directed to form a bearing surface 9 for bearing against a panel 21 of the metal box 20, while the other collar 10 is inwardly directed and bears against the end wall 6 of the housing 4 of the body 2. It is important for the bearing surface 9 to be continuous, i.e. in particular for it to have no slot or other discontinuity, in order to ensure that it performs the electromagnetic shielding function in effective manner.

Furthermore, the tubular wall of the body 2 cooperates with the tubular wall 8 and the radial collar 10 of the grounding plate 7 to define a housing 12 which receives a spring 13, the radial collar 10 forming a first bearing surface for the spring 13.

This housing 12 has an opening that extends radially and into which there is inserted part of a tubular fitting 14.

A radially extending wall of the fitting 14 closes the housing 12 and defines a second bearing surface for the spring 13.

The fitting 14 is made of metal and it is fixed to the body 2, e.g. by soldering or as a force-fit.

The spring 13 is arranged so that when no external stress is exerted on the grounding plate 7, it presses the radial collar 10 of the grounding plate 7 against the end wall of the housing 4, i.e. against the radial wall 6.

The connector 1 also has a metal tube 16 on the axis X with a free end forming an annular projection 19 whose function is described below.

An insulating tube 17 containing a central conductor 18 is inserted inside the body 2.

The body 2, the grounding plate 7, the fitting 14, and the tube 16 form a ground conductor suitable for engaging on a coaxial socket 22 mounted on a printed circuit card 23 inside the box 20.

Figure 2:
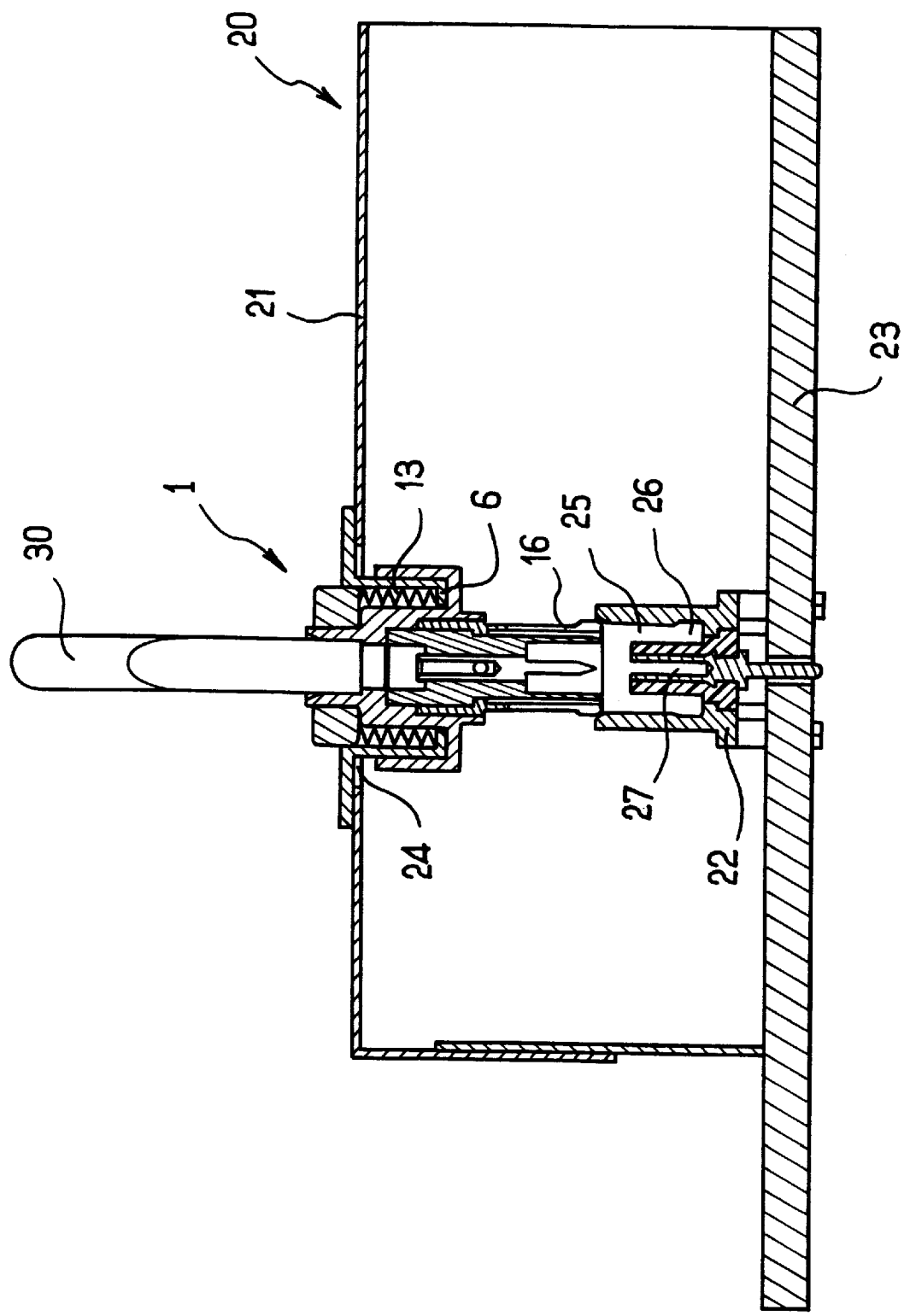
FIG. 2 is a section view of the FIG. 1 connector received in an opening in a wall of a metal box prior to the connector being fixed to a socket.

As can be seen in FIG. 2, the coaxial connector 1 is received in an opening 24 in a panel 21 of a metal box 20 for shielding an electronic module defined, in particular, by a printed circuit card 23.

The diameter of the opening 24 is greater than the diameter of the tubular portion of the body 2.

Thus, the connector 1 can move radially in the opening 24, with the radial collar 9 remaining in contact with the wall 21 of the box 20.

As a result, it is no longer essential for the socket 25 to be accurately positioned relative to the opening 24 in the metal box 20.

FIG. 2 shows the connector 1 placed in the opening 24 without being engaged in the socket 22.

The connector 1 is connected to a coaxial cable 30 provided with shielding that comes into contact with the box 20 via the grounding plate 7.

The socket 22 has a housing 25 whose bottom portion presents an internal cavity 26 of annular shape.

The socket 22 also has a housing 27 suitable for receiving the central conductor 18.

The connector 1 is fixed to the socket 22 by exerting pressure on a portion of the connector, e.g. on the fitting 14, so as to engage the projection 19 of the tubular portion 16 in the cavity 26 of the socket 22.

Figure 3:
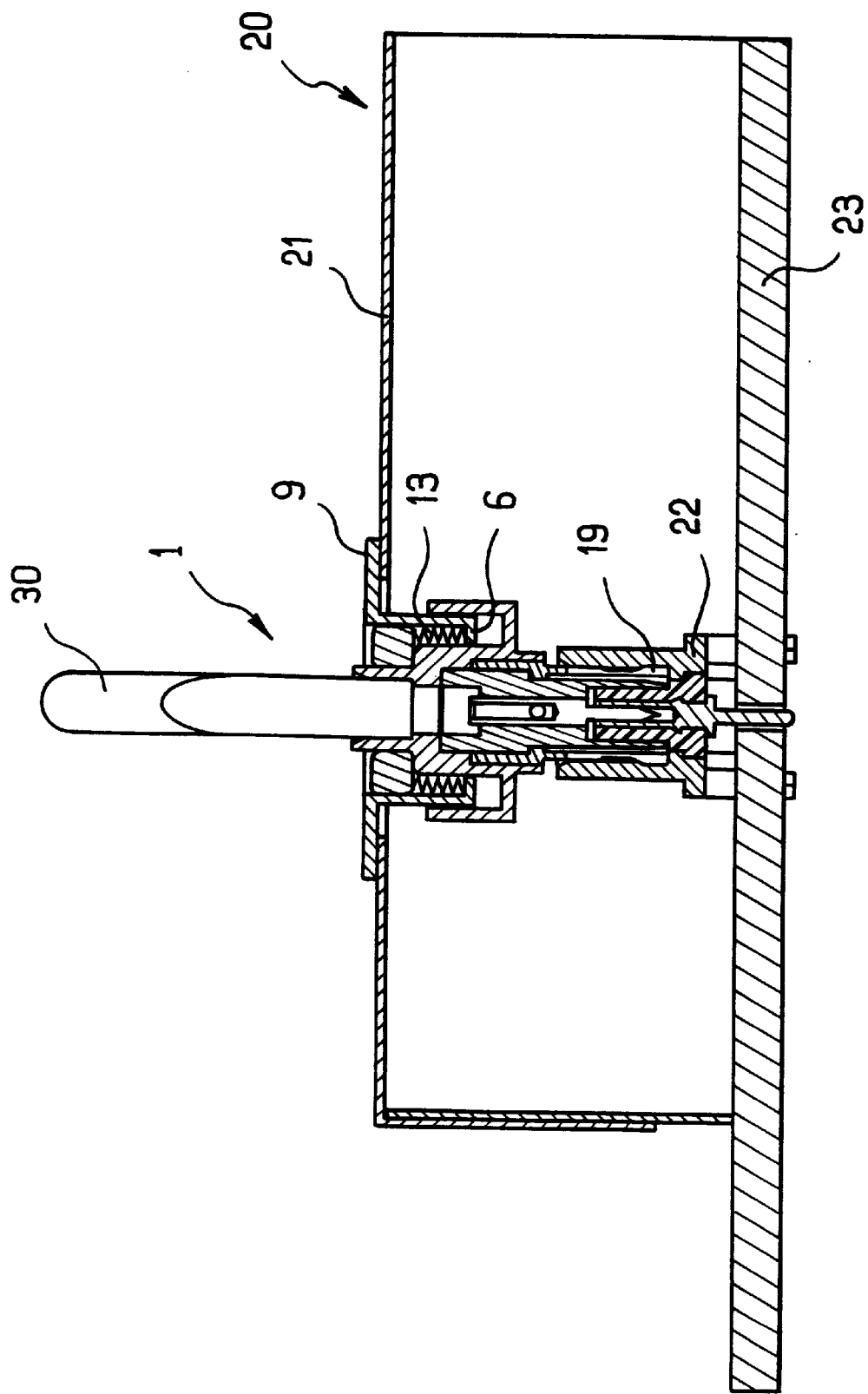
FIG. 3 is a view analogous to FIG. 2 after the connector has been fixed to the socket.

Thus, as shown in FIG. 3, the spring 13 is compressed and exerts axial stress on the radial collar 10 so as to keep the radial collar 9 in contact with the panel 21 of the box 20.

The spring is selected in such a manner that when the connector 1 is engaged in the socket 22, it exerts stress on the grounding plate 7 that is less than the stress necessary for disengaging the connector 1 from the socket 22.

Thus, it is particularly simple to engage the connector 1 in the socket 22, with this engagement being guaranteed by these two parts snap-fastening.

Although the invention is described with reference to a particular embodiment, the invention is not limited in any way thereto and any desirable modification can be made thereto without going beyond its scope as defined by the claims.

What is claimed is:

1. A coaxial connector for being received in an opening of a panel of a metal box, the connector comprising a conductive tubular body, a conductive tubular grounding plate and at least one resilient member, said grounding plate being movable in translation coaxially relative to said body, said grounding plate having a continuous rigid bearing surface for pressing against said panel, and said at least one resilient member being arranged to urge the grounding plate into a given position relative to the tubular body and to press the grounding plate against said panel when the connector is assembled with a complementary connector element.

2. A connector according to claim 1, wherein the body and the grounding plate are circularly symmetrical.

3. A connector according to claim 1, wherein the body has an extension from its side wall constituting a housing in which said grounding plate can move axially.

4. A connector according to claim 3, wherein the extension is parallel to and radially outwardly of said side wall of the body, said extension being interconnected to said side wall by a radial wall defining an end wall of the housing.

5. A connector according to claim 4, wherein the grounding plate has a tubular portion that engages in the housing of the body and is extended at each end by a respective rigid radial collar, one of said collars being outwardly directed and forming the bearing surface for pressing against said panel, the other collar being inwardly directed and adapted to bear against the end wall of the housing of the body.

6. A connector according to claim 5, wherein the tubular portion of the grounding plate co-operates with the wall of the body to form a second housing in which the resilient member is received, the inwardly-directed radial collar defining an end wall for said second housing and serving as a first bearing surface for the resilient member.

7. A connector according to claim 6, including a fitting secured to the body and arranged to define a second bearing surface for the resilient member.

8. A connector according to claim 7, wherein the fitting is substantially tubular in shape and is arranged in such a manner as to engage in part in the second housing of the grounding plate.

9. A connector according to claim 1, including snap-fastening means suitable for co-operating with corresponding means on a complementary connector element.

10. A connector according to claim 9, wherein the complementary connector element is a coaxial socket mounted on a printed circuit card placed in a metal box having an opening through which said connector is engaged.

11. A connector according to claim 9, wherein the resilient member is a spring having a return force smaller than a force required for disengaging the connector from the complementary connector element.

12. A connector according to claim 1, wherein the opening in the panel is sized to permit the connector to move radially in said opening, while maintaining the grounding plate in contact with the panel.

* * * * *